BIPOLAR AMPLIFIER

Original Filed July 30, 1965

ALLEN B. ROSENSTEIN
*INVENTOR.*

BY R. E. Geauque

ATTORNEY

BIPOLAR AMPLIFIER

Original Filed July 30, 1965

ALLEN B. ROSENSTEIN
*INVENTOR.*

BY R. E. Geauque

ATTORNEY 3,548,330
BIPOLAR AMPLIFIER
Allen B. Rosenstein, 314 S. Rockingham Ave., Los Angeles, Calif. 90049
Continuation of application Ser. No. 475,978, July 30, 1965. This application Mar. 19, 1969, Ser. No. 814,500
Int. Cl. H03f 3/18
U.S. Cl. 330—17 15 Claims

ABSTRACT OF THE DISCLOSURE

The invention comprises a direct-coupled, bipolar power amplifier employing two pairs of transistors of complementary symmetry in a cross-coupled arrangement. One pair of transistors is normally biased to cut off and have their bases referenced to a control junction which is tied to the first pair of transistors. Signal amplification in the first pair of transistors will shift the voltage at the control junction and cause one or the other of the transistors in the second pair to conduct, depending upon the polarity of the amplified signal. The symmetry of the circuit permits either input terminal to be connected in common wtih either output lead, or the input may be connected in common with either terminal of the main power supply. Alternatively, either terminal of the main power supply may be connected in common with one of the output terminals. Other modifications include the addition of series-connected transistors of like polarity to increase the output power, and negative-feedback networks to improve the linearity of amplification.

This application is a continuation of application Ser. No. 475,978, filed July 30, 1965, for "Bipolar Amplifier" by Allen B. Rosenstein.

This invention relates to a transistorized direct-coupled power amplifier and more particularly to a high-voltage wide-band bipolar amplifier employing pairs of transistors having complementary symmetry, arranged in a novel amplifying circuit for providing a linear output signal across a load in response to an input signal of varying polarity and amplitude.

The bipolar amplifier of the present invention employs two pairs of complementary transistors in a cross-coupled amplifier arrangement in which the operation is analogous to Class B operation. The circuit may be so adapted as to have a common signal input and output terminal, in which case a floating power supply is used, or may be arranged to have one terminal of the input common to the main power supply. That is, either signal lead may be connected in common with either output lead, or the input may be referenced to either power supply terminal.

It is therefore a principal object of the invention to provide a novel and improved amplifier having high power and wide bandwidth capabilities.

Another object of the invention is to provide a novel and improved transistorized direct-coupled amplifier which may be arranged to provide a terminal common to either input or output line, or to the input and either power supply terminal.

Still another object of the invention is to provide a novel and improved bipolar polarity-reversing switch capable of handling substantial amounts of power.

Yet another object of the invention is to provide a novel and improved direct-coupled bipolar amplifier which uses a single main power supply and which provides high efficiency with a polarity reversing output.

Many other advantages, features and additional objects of the present invention will become manifest to those versed in the art upon making reference to the detailed description and the accompanying sheets of drawings in which various embodiments incorporating the principles of the present invention are shown by way of illustrative examples.

The circuit operation is somewhat analogous to Class AB amplifier in that current flows principally through one transistor of the complementary pair for only one-half of the cycle of the input sinusoidal signal. In order for this to happen, the non-conducting transistor must have a bias equal to the cut off voltage. Transistors can be operated Class AB or Class B in a push-pull circuit with an appreciable improvement in the efficiency from a power standpoint, but a single-ended amplifier stage cannot be operated in Class B without introducing considerable distortion. As will be seen hereinafter the circuit of the present invention comprises a bridge circuit which operates much as a push-pull amplifier.

Figure 1:
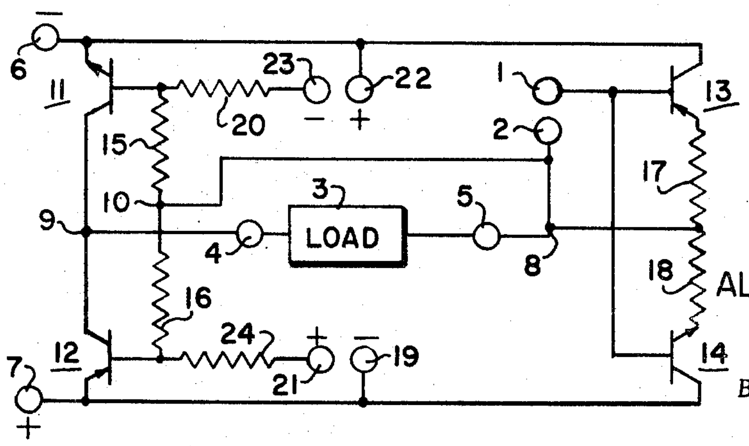
FIG. 1 is a simplified schematic circuit diagram of a bipolar amplifier constructed in accordance with the invention and having a common terminal between the input and output.

Looking now at FIG. 1 there is shown a first embodiment of the invention in which an input signal is applied to input terminals 1 and 2. A load 3 is connected between output terminals 4 and 5. As can be seen input terminal 2 is common to output terminal 5. A floating power supply from any suitable source is connected across terminals 6 and 7. Transistors 11 and 12 have their collectors connected in common to output terminal 4, and transistors 13 and 14 have their emitters connected through emitter resistors 17 and 18 to the junction 8 which is common to input terminal 2 and output terminal 5. The emitters of transistors 11 and 12, and the collectors of transistors 13 and 14, are connected directly to respective terminals of the power supply. Junction 8 may be grounded if desired.

Resistors 15 and 16 are connected between the bases of transistors 11 and 12, and the midpoint 10 therebetween is returned to reference junction 8. Resistors 17 and 18 optionally may be placed in series with respective ones of the emitter leads of transistors 13 and 14. The function of these series resistors 17 and 18 will be discussed hereinafter.

In a typical construction, the power supply voltage connected between terminals 6 and 7 may be of the order of 170 volts and the peak output signal appearing across load 3 may be +165 volts.

A bias voltage from any suitable source is supplied to terminals 19 and 21 which impresses a bias voltage on the base of transistor 12 via bias resistor 24. Similarly, a source of bias potential is applied across terminals 22 and 23 which applies a bias voltage to the base of transistor 11 via base resistor 20. This establishes a cut off condition of the transistors in the absence of an input signal. With zero potential between terminals 1 and 2, the amplifier will be balanced, or nearly balanced, with negligible current supplied to the load 3.

An input signal appearing at terminal 1 is applied simultaneously to the bases of transistors 13 and 14. Depending upon the instantaneous polarity of the input signal, one or the other of the transistors 13 or 14 will begin to conduct through the collector-to-emitter circuits. Transistors 11 and 12 are biased, by means of the voltages applied to terminals 19 and 21–23, to be at the verge of conduction. When one or the other transistor of the first pair 13 or 14 begins to conduct, it will change the midpoint 10 of the cross-coupling resistance network 15–16 causing one of the transistors of the second pair 11 or 12 to conduct. For example, if midpoint 10 moves negative, then transistor 12 will conduct and transistor 11 will be cut off. As a consequence, the potential appearing at terminal 4 of the load 3 will effectively be moved toward one or the other of the terminals of the power supply.

If input terminal 1 is made negative with respect to input terminal 2, then transistor 13 will be made to conduct and transistor 14 will be cut off. Terminals 5, 8 and 10 will then be taken negative, which causes transistor 12 to conduct and transistor 11 to cut off. Terminal 9, consequently, is taken positive. Current is applied to the load 3 through transistors 12 and 13.

If the polarity at input terminals 1 and 2 is reversed, the current through the load 3 reverses itself.

This circuit is best suited for a switching type of operation. The performance of this circuit as an amplifier is improved by the inclusion of resistors 17 and 18 in the emitter leads of transistors 13 and 14, thereby providing some negative feedback.

Figures 2, 4:
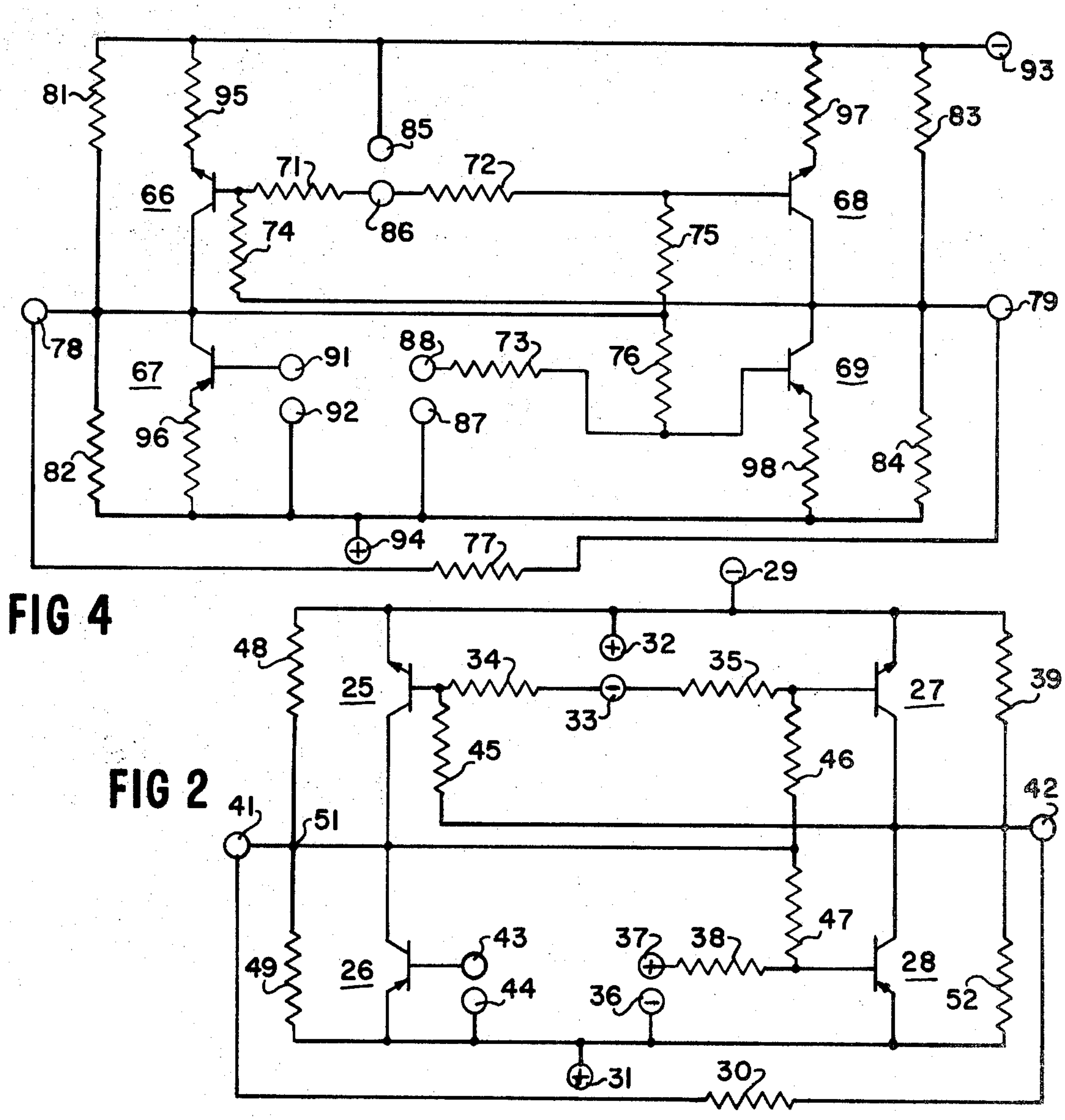
FIG. 2 is a bipolar switch embodiment of the invention having a common terminal between the input signal and the D-C power supply.
FIG. 4 is a schematic circuit diagram illustrating a modification of the embodiment of FIG. 2 wherein emitter resistors are employed to result in linear amplifier operation.

There is shown in FIG. 2 a modification of the circuit of FIG. 1 in which the input has a common terminal with the main power supply and the load is floating. This arrangement of the circuit comprises transistors 25–28 of which transistors 25 and 26 are connected in series across the power supply terminals 29 and 31. Transistors 27 and 28 are also connected in series across power supply terminals 29 and 31. The cross-coupled circuits slave transistors 27 and 28 to transistor 26, and transistor 25 to transistors 27 and 28. Transistors 25 and 27 are NPN types and transistors 26 and 28 are PNP types. Base bias for transistors 25 and 27 is provided from any suitable source connected to terminals 32 and 33 and is supplied to the base of transistor 25 via base resistor 34. Similarly, the bias voltage is applied to the base of transistor 27 via resistor 35. A bias supply is also connected to terminals 36 and 37, which applies a bias voltage to the base of transistor 28 via base resistor 38. The input signal is applied to terminals 43 and 44, the first of which connects directly to the base of transistor 26. As can be seen, the collectors of transistors 25 and 26 are connected in common to load terminal 41 and the collectors of transistors 27 and 28 are connected in common to load terminal 42. One terminal 44, of the input signal is made common to one terminal 31, of the power supply. The load 30 is connected between terminals 41 and 42. The common collectors of transistors 27 and 28 control transistor 25 via resistor 45. A signal network comprising resistors 46 and 47 is connected between the bases of transistors 27 and 28 and has its midpoint connected to the collectors of the opposite pair of transistors 25–26 to provide a control signal.

Bleeder resistors 48 and 49 may be connected between power supply terminals 29 and 31, and the midpoint 51 therebetween may be connected to the collectors of transistors 25 and 26 to balance this pair. Similarly, the remaining pair of transistors 27 and 28 may have their collectors connected to the midpoint between bleeder resistors 39 and 52.

Assuming that the polarity of the input signal applied to terminal 43 is negative with respect to input terminal 44, transistor 26 will be made to conduct. The positive-going change in collector voltage at terminal 51 will be coupled through resistors 46 and 47, and result in transistor 27 being made to conduct while transistor 28 is made to cut off. The negative signal at the collectors of transistors 27 and 28 will be coupled through resistor 45 to cut off transistor 25. Current will then flow from the positive power supply terminal 31 through conducting transistor 26, thence through the load 30 (which is connected across terminals 41 and 42) and then through conducting transistor 27 to negative power supply terminal 29.

If the polarity at input terminals 43 and 44 is reversed, then the current through the load 30 will be through conducting transistors 25 and 28, and of opposite polarity.

The operation of the circuit of FIG. 2 is similar to that of the circuit of FIG. 1 except that the input signal is applied to the single transistor 26. A change in the collector voltage of transistor 26, at terminal 51, is coupled through resistors 46 and 47 to be amplified by transistors 27 and 28. The amplified signal at terminal 42 is coupled through resistor 45 to be amplified further by transistor 25. For small changes in input signal, the cascaded amplifiers will give full output.

Figures 3, 5:
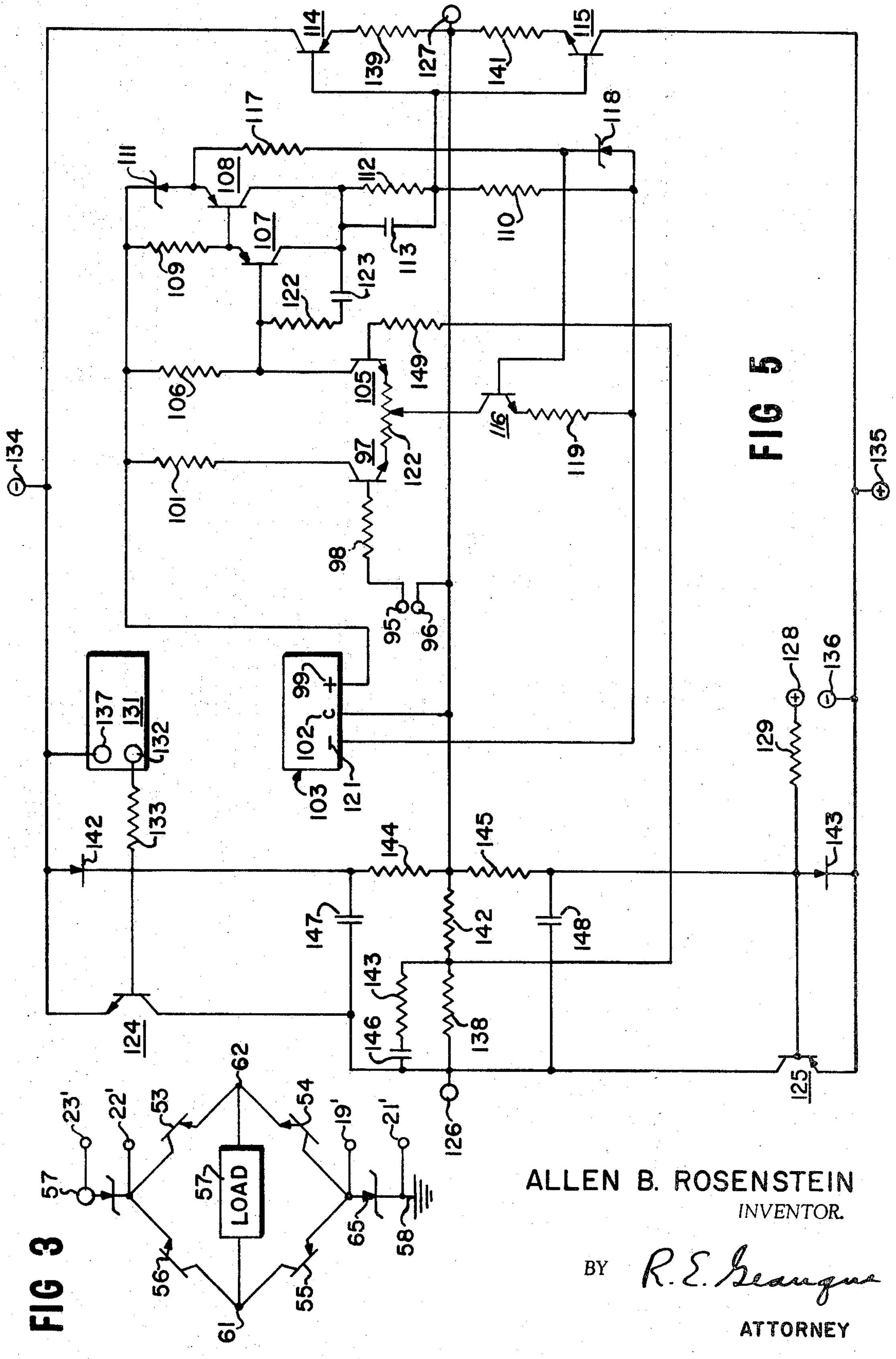
FIG. 3 is a simplified schematic circuit diagram useful in the exposition of the invention.
FIG. 5 is a detailed schematic circuit diagram of a power amplifier constructed in accordance with the invention and having a common terminal between the input and output.

Looking now at FIG. 3 there is shown a simplied version of the two above-described circuits. As can be seen, the transistors are arranged in a bridge configuration. Transistors 53–56 are connected in pairs having a complementary symmetry and with the power supply connected between negative power supply terminal 57 and positive power supply terminal 58. The load 59 is connected across the opposite corners of the bridge 61–62. As can be seen, this arrangement will permit any one of the terminals 57, 58, 60, 61, 62 or 64 to be grounded. The necessity of separate bias supplies may be obviated by means of power Zener diodes placed in series with the main power supply. This arrangement is shown in FIG. 3 wherein Zener diode 63 has its anode connected to negative power supply terminal 57, and its cathode connected to corner 64 of the bridge circuit. The bias voltage will then appear across the diode 63 and is made available at terminals 22′ and 23′, which correspond to terminals 22 and 23, respectively, of FIG. 1. Similarly, Zener diode 65 is connected between positive power supply terminal 58 (which may be grounded) and corner 60 of the bridge. The bias voltage appearing across diode 65 is available at terminals 19′ and 21′, which correspond to terminals 19 and 21, respectively, of FIG. 1. The use of Zener diodes to provide the bias voltages may be incorporated into either of the circuits of FIGS. 1, 2, 4 or 5.

The circuit shown in FIG. 4 is basically the same as that of FIG. 2 except that it is modified to perform more effectively as a linear amplifier than the switching type version of FIG. 2. This circuit comprises transistors 66–69. Bias is supplied to the bases of transistors 66, 68, and 69 via resistors 71–73, respectively. The signal control networks comprise resistors 73–76. The load resistance 77 is connected between terminals 78 and 79 which are referenced to the power supply via the voltage dividing networks comprising resistors 81–82 and 83–84, respectively. A bias voltage is applied to terminals 85 and 86 for establishing the quiescent state of transistors 66 and 68, and a bias potential for establishing the quiescent state of transistor 69 is applied to terminals 87 and 88.

The input signal is applied across terminals 91 and 92. The main power supply is connected to negative terminal 93 and positive terminal 94. As in the previously described embodiment of FIG. 2, one terminal 92 of the input is common to one terminal 94 of the power supply. If desired, power supply terminal 94 may be grounded.

The embodiment of FIG. 4 differs primarily from the embodiment of FIG. 2 in that it includes resistors 70, 80, 89 and 90, each of which is connected in series with the emitter lead of a corresponding one of transistors 66–69. As stated previously, this circuit operates in the same manner as the circuit of FIG. 2 except that the gain of the amplifier is reduced and controlled by the insertion of resistors 70, 80, 89 and 90 in the emitter circuits of the transistors 66–69, respectively. The addition of these emitter resistors results in individual negative feedback for each transistor and thus permits more of a linear amplification action and less of a switching action to occur. The feedback causes the amplifier to become very linear while retaining the bipolar characteristics.

It should be understood that the bias potentials which are to be applied to terminals 85–87 may be derived from a Zener diode in the manner shown and described in connection with FIG. 3.

There is shown in FIG. 5 a schematic circuit diagram of a fully implemented embodiment of the invention in which one terminal of the input 96 is common with the output. The input signal is applied to terminals 95 and 96. The input signal appearing at terminal 95 is supplied to the base of transistor 97 via input resistor 98. The collector of transistor 97 is supplied from positive bias supply terminal 99 via resistor 101. The common terminal 102 of bias supply 103 is connected to the main reference line 104 which also connects to terminal 96. Transistor 97 in conjunction with transistor 105 comprises a differential input amplifier. Operating potential is supplied to transistor 105 via resistor 106. The output from the differential amplifier 97 and 105 is applied to the base of transistor 107. Transistor 107 in conjunction with transistor 108 comprises a two-stage, direct-coupled, voltage amplifier. Operating potential is supplied to transistor 107 via resistor 109 and to transistor 108 via Zener diode 111. The amplifier output is obtained from the common collectors of transistors 107 and 108 and is supplied through the network comprising resistors 110 and 112, and capacitor 113 to the common bases of transistors 114 and 115. Resistor 110 is the collector resistor for transistor 108.

The base of transistor 107 obtains degenerative feedback via the network comprising resistor 122 and capacitor 123.

Transistor 116, resistor 119, and Zener diode 118 combine to form a constant current supply for the common emitters of the differential amplifier 97, 105. The Zener voltage across diode 118 bucks the voltage appearing across resistor 119, thus making the current at the collector of transistor 116 constant. The zero-setting adjustment of the differential amplifier 97, 105 is made by means of potentiometer 122.

Transistors 114 and 115 together with transistors 124 and 125 comprise the bipolar bridge circuit. The output load, which is not shown in FIG. 5, is connected between terminals 126 and 127. Terminal 127 may be grounded if desired, and as can be seen, it is common to input terminal 96, as well as bias power supply terminal 102. Cut-off bias is supplied to transistor 125 from a suitable bias supply connected to terminal 128 via resistor 129. Similarly, cut-off bias is supplied to transistor 124 from a suitable bias supply 131 connected to terminal 132, via resistor 133.

The main power supply is connected between negative terminal 134 and positive supply terminal 135. The positive bias applied to terminal 128 is returned to the main power supply via terminal 136. Similarly, the negative bias applied to terminal 132 is referenced to the main power supply via terminal 137. Resistors 139 and 141, placed in series with the emitter leads of transistors 114 and 115, respectively, provide degeneration to improve the performance of the circuit as a linear amplifier.

Diodes 152 and 153 are protective diodes to prevent reverse voltages from being applied to the emitters of transistors 124 and 125, respectively. Resistors 138 and 142 comprise a divider which provides a negative feedback signal which is compared in the differential amplifier 97 and 105 with the input signal 95–96. The feedback voltage appears across resistor 142 and is applied to the base of transistor 105 via base limiting resistor 149. The networks comprising resistors 143–145 and capacitors 146–148 are used to improve the stability of the bipolar amplifier. The gain of the amplifier may be changed by varying the ratio of the resistances of feedback resistors 138 and 142.

As can be seen, the main power supply applied across terminals 134 and 135 is floating, and the output which is connected between terminals 126 and 127 may be referenced to ground, as is the input at terminal 96. The auxiliary power supply 103 may also have its common terminal 102 referenced to ground. This bipolar amplifier may be modified to provide greater output power by the addition of series-connected transistors, of like polarity, in the circuit paths of the bridge transistors 114, 115, 124 and 125.

As in the simplified embodiment described in FIG. 1, the application of an input signal of a given polarity across terminals 95 and 96 will cause transistors 114 and 125 to conduct, or transistors 115 and 124 to conduct, depending upon the polarity of the input signal. Reversal of the polarity of the input signal will cause the opposite pair of transistors to conduct, i.e., transistors 115 and 124. The cut-off bias supplies connected to terminals 128 and 136 establish a zero level of the output signal in the absence of any input signal. The circuit of FIG. 5 is an extension of the circuit of FIG. 1 to include a difference amplifier in the input. Negative feedback is also provided from the output, taken from resistor 142 to feed back to transistor 105 via resistor 149.

Transistor 116, together with Zener diode 118, results in a constant-current common emitter drive of the differential amplifier 97 and 105. If desired, a resistor could be substituted for this portion 116, 118, and 119 of the circuit. The bipolar amplifier circuit of FIG. 5 will provide linear direct current amplification, at a high output voltage, without regard to polarity of the input signal.

While there have been shown and described and pointed out the fundamental novel features of the invention as applied to preferred embodiments, it will be understood that various omissions and substitutions and changes in the form and details of the devices illustrated and in their operation may be made by those skilled in the art, without departing from the spirit of the invention; therefore, it is intended that the invention be limited only as indicated by the scope of the following claims.

What is claimed is:

1. A bipolar amplifier comprising:

first, second, third and fourth transistors each having an emitter, a base and a collector, said first and second transistors being of complementary symmetry and said third and fourth transistors being of complementary symmetry;

first and second resistances connected in series between the bases of said first and second transistors and having a reference junction therebetween;

a two-terminal load impedance, one terminal of which is connected in common to the collectors of said first and second transistors and the other terminal of which is connected to said reference junction;

a pair of input terminals adapted to be connected across a signal voltage source, one of said input terminals being connected to the base of said third transistor, and the other of said input terminals being connected to said reference junction;

means for supplying direct-current biasing voltages to said first and second transistors to establish a substantially non-conducting state thereof in the absence of an input signal applied to said input terminals; and a source of direct-current operating potential, one terminal of which is connected in common to said first transistor and said third transistor and the other terminal of which is connected in common to said second transistor and said fourth transistor.

2. A bipolar amplifier as defined in claim 1, including:

a common terminal connected to said other terminal of said load impedance and to said other input terminal.

3. A bipolar amplifier as defined in claim 1 wherein said means for biasing comprises:

a Zener diode connected between said one terminal of said source of operating potential and a common connection to the emitter of said first transistor and the collector of said third transistor to establish a cut-off condition therein in the absence of a signal applied to the base thereof; and a second source of bias potential connected to the base of said second transistor to establish a cut-off condition therein in the absence of an input signal to the base thereof.

4. A bipolar amplifier as defined in claim 3 wherein said first source of bias potential comprises:

a Zener diode connected between said one terminal of said source of operating potential and a common connection to the emitter of said first transistor and the collector of said third transistor.

5. A bipolar amplifier as defined in claim 3 wherein said second source of bias potential comprises:

a Zener diode connected between said other terminal of said source of operating potential and a common connection between the emitter of said second transistor and the collector of said fourth transistor.

6. A bipolar amplifier comprising:

first, second, third and fourth transistors each having an emitter, a base and a collector, said first and second transistors being of complementary symmetry and said third and fourth transistors being of complementary symmetry;

first and second resistances connected in series between the bases of said first and second transistors and having a reference junction therebetween;

a two-terminal load impedance, one terminal of which is connected in common to the collectors of said first and second transistors and the other terminal of which is connected to said reference junction;

means for applying an input signal between the base of said third transistor and said reference junction;

means for biasing said first and second transistors to a substantially non-conducting state in the absence of an input signal; and a source of operating potential, one terminal of which is connected in common to the emitter of said first transistor and the collector of said third transistor and the other terminal of which is connected in common to the emitter of said second transistor and the collector of said fourth transistor.

7. A bipolar amplifier as defined in claim 6 including:

a resistance network connected between said reference junction and the emitters of said third and fourth transistors.

8. A bipolar amplifier as defined in claim 6 including:

four resistors, one each of which is connected in series with the emitter of a corresponding one of said transistors, in order to provide degeneration and thus improve the linearity of said amplifier.

9. A bipolar amplifier comprising:

two pairs of transistors, the transistors of each pair having complementary symmetry, and each transistor having a base, an emitter, and a collector;

a two-terminal load impedance having a first terminal connected in common to the collectors of one pair of transistors of complementary symmetry and a second terminal connected in common to the collectors of the other pair of transistors of complementary symmetry;

a source of direct-current operating potential, one terminal of which is connected in common to the emitters of the transistors of a first like symmetry and the other terminal of which is connected in common to the emitters of the transistors of the second like symmetry;

first and second resistances connected in series between the bases of said other pair of transistors and having a reference junction therebetween;

means for connecting an input signal between the base of a transistor comprising said one pair of transistors of complementary symmetary and said reference junction;

means biasing said first and second transistors to a substantially non-conducting state in the absence of an input signal applied to said input signal connecting means; and means for connecting said reference junction to said second terminal of said load impedance.

10. A bipolar amplifier as defined in claim 9 including:

a differential amplifier having two inputs and an output, one of said inputs being connected to said input signal connecting means, and the other of said inputs being connected to said reference junction, and said output being connected to both bases of said other pair of transistors.

11. A bipolar amplifier as defined in claim 9 including:

a common terminal connected to said other terminal of said source of operating potential and to said input signal connecting means.

12. A bipolar amplifier as defined in claim 9 including:

a first source of bias potential connected to the base of a first transistor in said one pair of transistors of complementary symmetry and to the base of a first transistor in said other pair of transistors; and a second source of bias potential connected to the base of the second transistor of said one pair of transistors.

13. A bipolar amplifier as defined in claim 12 wherein said first source of bias potential comprises:

a Zener diode connected between said one terminal of said source of operating potential and the common connection between the base of said first transistor in said one pair of transistors and the base of said first transistor in said other pair of transistors.

14. A bipolar amplifier as defined in claim 12 wherein said second source of bias potential comprises:

a Zener diode connected between said other terminal of said source of operating potential and the second transistor of said other pair of transistors.

15. A bipolar amplifier as defined in claim 12 including:

four resistors, one each of which is connected in series with the emitter of a corresponding one of said transistors in order to provide degeneration and thus improve the linearity of said amplifier.

References Cited

UNITED STATES PATENTS

| | | | |
|---|---|---|---|
| 3,054,067 | 9/1962 | Merrill et al. | 330—13X |
| 3,175,100 | 3/1965 | La Mothe | 330—17X |
| 3,175,211 | 3/1965 | Lee et al. | 330—17X |

ROY LAKE, Primary Examiner

L. J. DAHL, Assistant Examiner

U.S. Cl. X.R.

330—13